United States Patent
Fischer et al.

(10) Patent No.: US 9,771,650 B2
(45) Date of Patent: Sep. 26, 2017

(54) METHOD FOR MODIFYING A TCO COATING

(71) Applicant: Fraunhofer-Gesellschaft zur Förderung der angewandten Forschung e.V., Munich (DE)

(72) Inventors: Vincent Fischer, Dresden (DE); Benjamin Graffel, Zwickau (DE); Falk Winckler, Rippien (DE); Björn Meyer, Dresden (DE); Matthias Fahland, Dresden (DE); Steffen Günther, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/247,403

(22) Filed: Aug. 25, 2016

(65) Prior Publication Data

US 2017/0067148 A1    Mar. 9, 2017

(30) Foreign Application Priority Data

Sep. 8, 2015 (DE) ................... 10 2015 115 006

(51) Int. Cl.
*C23C 14/00* (2006.01)
*C23C 14/58* (2006.01)
*C23C 14/08* (2006.01)

(52) U.S. Cl.
CPC ........ *C23C 14/582* (2013.01); *C23C 14/0036* (2013.01); *C23C 14/086* (2013.01); *C23C 14/5846* (2013.01); *C23C 14/5873* (2013.01)

(58) Field of Classification Search
CPC .............. C23C 14/582; C23C 14/5873; C23C 14/5846; C23C 14/0036; C23C 14/086
USPC ............................................ 250/492.1–492.3
See application file for complete search history.

(56) References Cited

U.S. PATENT DOCUMENTS

2011/0195196 A1*  8/2011  Kim ..................... C23C 14/086
                                                        427/453

FOREIGN PATENT DOCUMENTS

| DE | 10 2006 047 472 A1 | 4/2008 |
| DE | 10 2009 033 417 A1 | 12/2010 |
| DE | 10 2011 005 753 A1 | 3/2013 |
| DE | 10 2013 107 799 A1 | 12/2014 |

OTHER PUBLICATIONS

Jäger, T. et al., "Thin films of $SnO_2$:F by reactive magnetron sputtering with rapid thermal post-annealing," dated Dec. 28, 2013, pp. 21-25, Thin Solid Films, 553 (2014) 21-25, © 2013 Elsevier BV.

* cited by examiner

*Primary Examiner* — Michael Maskell
(74) *Attorney, Agent, or Firm* — Brinks Gilson & Lione

(57) ABSTRACT

Methods are provided for modifying a transparent and electrically conductive metal-oxide coating deposited on a plastic substrate. At least one surface region of the metal oxide coating is impinged by a pulse-driven electron beam. The impingement of the surface region of the metal oxide coating by the pulse-driven electron beam occurs inside a vacuum chamber into which hydrogen, argon, nitrogen, or oxygen, or a gas mixture of at least two of the above-mentioned gasses has been introduced.

4 Claims, 2 Drawing Sheets

METHOD FOR MODIFYING A TCO COATING

CROSS-REFERENCE TO RELATED APPLICATIONS

This application claims priority under 35 USC §119 to German Patent Application No. 10 2015 115 006.9, filed Sep. 8, 2015, and entitled "Verfahren zum Modifizieren einer TCO-Schicht," the entire contents of which are hereby incorporated herein by reference.

TECHNICAL FIELD

The invention relates to a method for modifying transparent and electrically conductive metal oxide coatings, which are deposited on plastic substrates, by subjecting the coating to a heat treatment.

BACKGROUND

Coatings play a decisive role in substrates of all types in order to make possible their usability in various applications. In the case of plastics, and in particular plastic foils, such a refining step represents a weak point in many cases. One of the significant reasons for this is the low thermal stability of many plastics. Numerous coating technologies require preheated substrates in order to achieve the desired coating properties. Examples of this are thermochromic coatings, which are increasingly used in the field of so-called "smart windows", barrier coatings, optical coatings, or transparent conductive coatings. For the group of transparent and electrically conductive metal oxide coatings (also called transparent conductive oxide, or TCO) on plastic foils, a variety of possible uses arise, such as, for example, in displays/advertisements, lights, as well as energy generation.

In the TCO coatings that are manufactured with a heated substrate, semi-crystalline or crystalline coatings result with a good electrical conductivity that are often also characterized by light transparency. By means of a thermic post-treatment of such coatings, coating defects can be annealed, as a result of which both the light transparency and the mobility of the charge carriers can be easily improved, and consequently also the electrical conductivity. In the TCO coatings that are manufactured with an unheated substrate, tempering the amorphous coating after depositing the coating can bring about a structural relaxation by local rearrangement, which increases the charge carrier concentration. Here, a crystallization process also occurs with nucleation and grain growth, which improves the mobility of the charge carriers.

By using a thermal post-treatment at high temperatures of approximately 300° C. to 600° C. on the applied TCO coatings, the electrical conductivity and the transparency of TCO coatings can be improved still further. Here, a lattice structure forms inside the coating, the ions assume energetically more favorable positions, and the number of scattering centers is reduced, which leads to a drastic reduction of the absorption or recombination. For a heat treatment, the heat temperature, the time the coated substrate stays in the heating system, and the optical properties of the coated substrate are decisive. What is negative with the heat treatment is that the heat absorption in a heating station is complicated in TCO coatings due to the higher reflection in the infrared spectral range. Furthermore, the required temperatures cannot be used on temperature-sensitive substrates either in the coating or in the post-treatment. For this reason, in TCO coatings that are applied to plastics, only a poor electrical conductivity and a poor transparency are often achieved.

In DE 10 2006 047 472 A1, it is disclosed that following a surface coating of thin functional coatings made of the most diverse materials for manufacturing electronic components, at least one thermal post-treatment by means of pulsed short-wavelength electromagnetic radiation, while avoiding an immediate heating of the entire substrate, leads to an annealing of structural defects. Here, the thermal post-treatment is affected by one or more gas discharge lamps, by at least one arc pulse, or by Xenon arc lamps. The pulse duration varies from 0.2 to 100 ms, and the pulse energy from 0.1 to 100 $J/cm^2$. Furthermore, the pulse intensity, the pulse repetition frequency, the pulse shape, and the pulse duration of successive arc pulses must be adapted to the thickness of the coating to be treated and the mass of the substrate. The energy of the radiation can be increased by coupling the substrate to a larger mass.

A temperature treatment by laser radiation, a temperature treatment in a high-convection oven, or in a two-chamber oven after the deposition of a variety of transparent conductive metal oxides at low substrate temperatures, by means of which a deposited coating can be improved with respect to conductivity and transparency, is known from DE 10 2009 033 417 A1. Here, the temperature treatment occurs in ambient air in a continuous process using one or more laser diodes, Nd:YAG lasers or Yb:YAG/disk lasers. Due to the integration of a diffusion barrier, or an optical interference coating, the energy of the laser can be increased and the substrate is not excessively heated.

DE 10 2011 005 753 A1 shows that a pulse-like energy input by electromagnetic radiation as well as particle bombardment with high energy density in the atmosphere can affect an improvement of the properties of TCO coatings on plastic substrates, but limits the temperature range allowed for the substrate from room temperature to 180° C. Thus, the maximum processing temperature of the plastic, which should also not be exceeded during the coating of the substrate, is specified as the upper limit for the post-treatment. The heat treatment occurs along a line transverse to the transport direction of the substrate, and can be performed using lasers, gas discharge lamps (arc or halogen lamps) as well as an electron beam. The exposure time used here varies between 1 μs and 1 s. By using a separation coating between the substrate and the TCO coating made of a material having low thermal conductivity, the energy of the thermal post-treatment can be increased, which affects an additional improvement of the coating properties. In this case, it is disadvantageous that a heat treatment of a TCO coating, which should not heat a substrate to more than 180° C., often does not lead to the desired coating properties.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

The aim of all above-described methods is to improve the electrical conductivity and/or the light transparency of TCO coatings. However, none of the described methods offer a solution for worsening the electrical conductivity of TCO coatings, at least in partial regions. This can be necessary, for example, if a partial region of a TCO coating is to be configured electrically isolated from another partial region of the TCO coating.

Therefore, the underlying technical problem of the invention is to provide a method by means of which TCO coatings deposited on plastic substrates can be modified with respect to the electrical conductivity and/or to the light transparency. With the inventive method, it should be possible to improve or worsen the electrical conductivity of TCO coatings completely and/or only in partial regions. It should also be possible to integrate the inventive method into processes and systems wherein TCO coatings are deposited under vacuum conditions.

It is known that both the electrical conductivity and the light transparency of TCO coatings have a dependency on the amount of oxygen bound in the TCO coating. The aim of the inventive method therefore is to modify the electrical conductivity and/or the light transparency of a TCO coating after the deposition of the coating on a plastic substrate, by changing the percentage of oxygen in the deposited coating.

In the inventive method for modifying a transparent and electrically conductive metal oxide coating deposited on a plastic substrate, at least one region of the metal oxide coating is subjected to a heat treatment by impinging (202) a surface region with an electron beam. Here, the impingement (202) on the surface region of the metal oxide coating by the electron beam occurs inside a vacuum chamber, into which hydrogen, argon, nitrogen, oxygen, or a mixture of at least two of the above-mentioned gases is introduced. For an effective operation of the electron beam, it is advantageous if a maximum pressure of 10 Pa prevails in the process chamber.

The present invention will be explained in more detail below with reference to exemplary embodiments. In a first exemplary embodiment, an ITO (indium tin oxide) coating is first deposited on a PET (polyethylene terephthalate) substrate by means of reactive magnetron sputtering inside a vacuum chamber, wherein the inflow amount of the reactive gas oxygen into the vacuum chamber was set differently in a plurality of test runs during the deposition of the coating.

Figure 1:
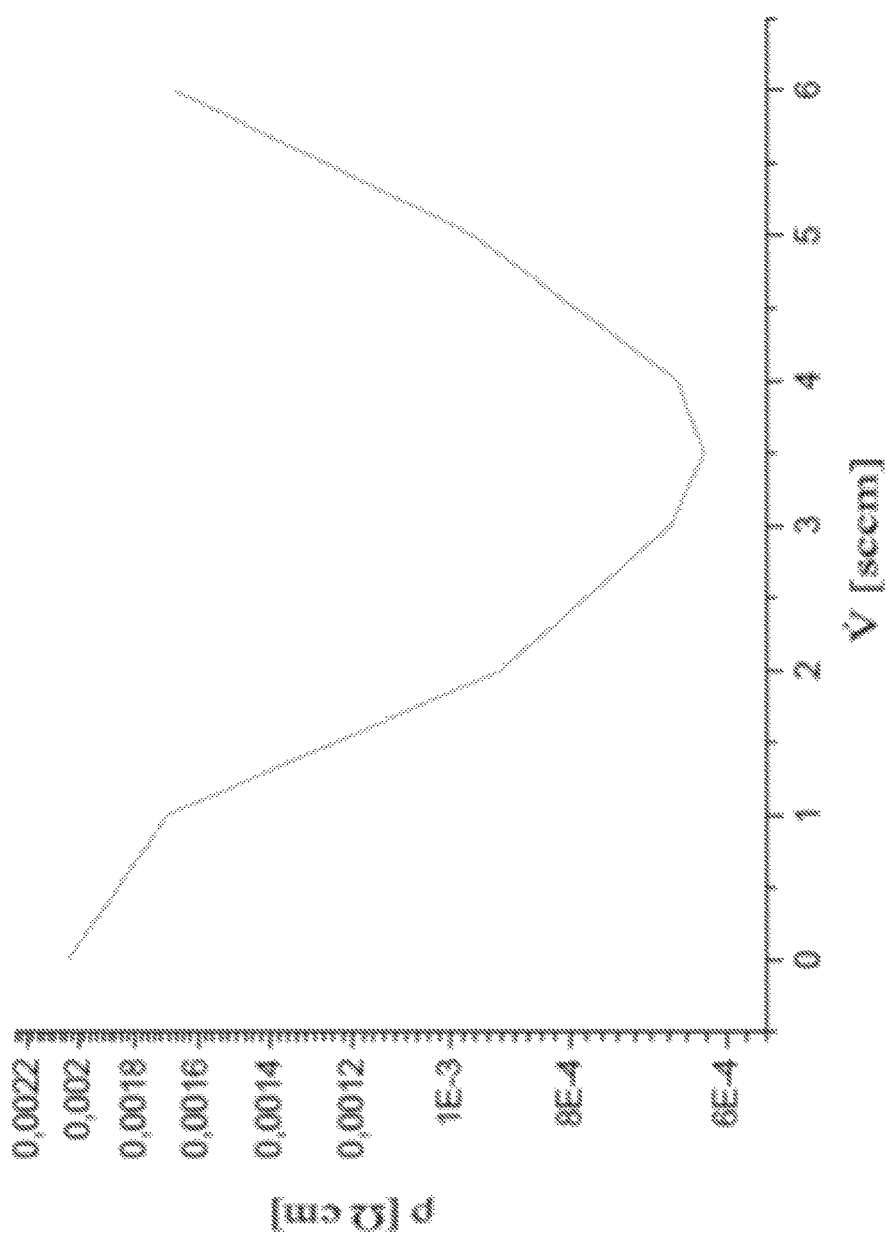
FIG. 1 shows a graphical depiction of the dependency of specific resistance of an ITO coating on the inflow amount of the reactive gas oxygen in a vacuum chamber while the coating is being deposited.
Figure 2:
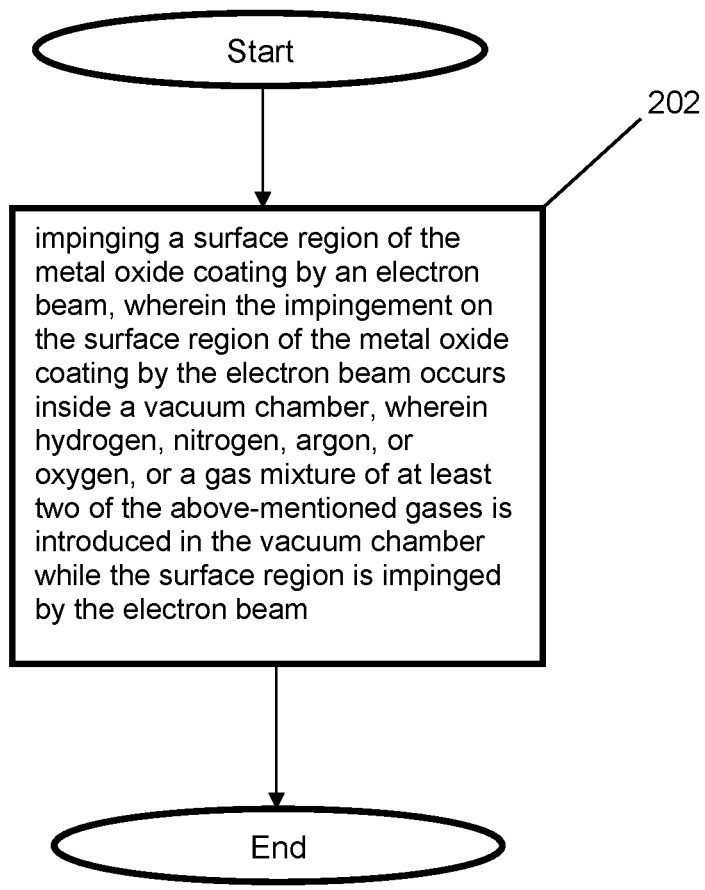
FIG. 2 illustrates a flow diagram of a method for modifying a transparent and electrically conductive metal oxide coating deposited on a plastic substrate.

FIG. 1 shows a graphical depiction of the dependency of the specific resistance of the ITO coating on the inflow amount of the reactive gas oxygen in the vacuum chamber while the coating is being deposited. From FIG. 1 it can be seen that the specific resistance of the ITO coating initially decreases with an increasing inflow amount of the reactive gas oxygen into the vacuum chamber until the specific resistance reaches a minimum at an inflow amount of 3.5 sccm (standard cubic centimeters per minute). With a further increase of the inflow amount of the reactive gas oxygen into the vacuum chamber, the specific resistance of the deposited ITO coating then increases again. For the sake of completeness, it should be noted that the raising of the inflow amount of the reactive gas oxygen while the coating is being deposited is accompanied by an increase of the amount of oxygen incorporated in the coating. A variety of TCO materials have such a parabolic shape of the dependency of the coating resistance on the amount of oxygen incorporated into the coating.

A batch of the PET substrate with an ITO coating deposited thereon, wherein 5 sccm oxygen was introduced into the vacuum chamber during the reactive coating deposition and which ITO coating had a specific resistance of $8.9 \times 10^{-4}$ after the coating deposition, was subsequently subjected to the inventive method. For this purpose, the PET substrate coated with ITO was introduced into a vacuum chamber, and there the surface of the ITO coating was impinged by an electron beam by scanning the surface of the ITO coating with the electron beam. Here, the power as well as the time of exposure to the electron beam was set according to known methods such that the impingement on the surface of the ITO coating by the electron beam did not lead to any thermal damage to the plastic substrate. While the ITO coating was being impinged by the electron beam, hydrogen was introduced into the vacuum chamber. It could be observed through a sight glass in the vacuum chamber that at the points at which the electron beam impinged on the coating surface, a bluish, luminous and locally delimited light appearance formed, which indicated that plasma was formed at these points. After the complete scanning of the coating surface, a specific resistance in the modified ITO coating of $6.49 \times 10^{-4}$ Wcm was detectable. Due to the inventive modification of the ITO coating, the coating resistance was reduced, and consequently the electrical conductivity of the ITO coating was increased. In addition, after the inventive modification of the ITO coating, an increase of the light transparency was detectable.

The reduction of the coating resistance as a result of the inventive modification of the ITO coating is due to the fact that by adding hydrogen during the action of the electron beam on the ITO coating, an electron beam induced plasma forms, which activates coating particles to the extent that the hydrogen reacts to the oxygen stored in the coating, and a chemical compound forms. In this way, the ITO coating is deprived of oxygen, which up to a certain degree is accompanied by a reduction of the coating resistance according to the dependency depicted in FIG. 1. For the sake of completeness, it should be noted that the reaction products of the plasma-initiated compound of hydrogen and the oxygen formerly stored in the coating are suctioned by the vacuum pumps of the vacuum chamber.

It can therefore be established that due to the addition of hydrogen during the heat treatment of a TCO coating by an electron beam inside a vacuum chamber, the amount of oxygen in the TCO coating can be reduced, which is accompanied by a change in the electrical conductivity and often also in the transparency of the TCO coating. A change in the electrical conductivity of a TCO coating can also be detected, if nitrogen or argon, or a gas mixture of at least two gases from the group hydrogen, nitrogen, or argon is introduced into the vacuum chamber during the electron beam treatment.

By using the inventive method, the oxygen amount of an already deposited TCO coating can, however, not only be reduced, but the oxygen content can also be increased therewith, as is presented below in the second exemplary embodiment. In the second exemplary embodiment, a gallium doped zinc oxide coating (GaZO coating) is deposited on a PET substrate by means of reactive magnetron sputtering. A GaZO coating also has a parabolic dependency, as depicted in FIG. 1, of the coating resistance on the flow amount of the reactive gas oxygen introduced into the vacuum chamber while the coating is being deposited. For the inventive modification of the GaZO coating, a batch of the coated PET substrate was chosen in which only a small flow amount of 0.7 sccm oxygen was introduced into the vacuum chamber during the deposition of the coating, and a specific coating resistance of $3.0\times10^{-3}$ Wcm was measured after the deposition of the coating. This corresponds to an operating point that is located on the left decreasing parabolic limb with respect to a graphic according to FIG. 1. This means that a reduction of the specific coating resistance and thus an improvement of the electrical conductivity of the GaZO can be achieved by somewhat more hydrogen being bound in the GaZO coating. According to the invention, this is realized by the GaZO coated PET substrate being introduced into a vacuum chamber and the surface of the GaZO coating being impinged there by a pulsed electron beam by scanning the surface of the GaZO coating with the electron beam. Oxygen is introduced into the vacuum chamber while the GaZO coating is being impinged by the electron beam. In this manner, an electron beam plasma is formed around the impingement point of the electron beam on the GaZO coating causing the coating particles to be activated and excited, producing a compound in which the oxygen introduced into the vacuum chamber is bound to additional oxygen in the GaZO coating. According to the inventive modification of the GaZO coating, a reduced specific resistance of $1.7\times10^{-3}$ Wcm was thus also detectable.

It is thus shown that by means of the inventive method, the oxygen amount of a TCO coating deposited on a plastic substrate can be both increased and decreased, which entails an associated change of the electrical conductivity and also of the transparency of the TCO coating. This is effected by an electron beam treatment of the already deposited TCO coating when the hydrogen or oxygen is introduced into the vacuum chamber. Alternatively, the amount of oxygen in a TCO coating can also be changed by performing this electron-beam treatment while the coating is being deposited.

As has already been shown, it can not only be advantageous to increase the electrical conductivity of a deposited TCO coating or a partial region of this coating by means of the inventive method; with the inventive method, TCO coatings or partial regions of these coatings can also be modified towards a worsened electrical conductivity. This can be necessary, for example, to form areas of a TCO coating with poor electrical conductivity, which are intended to electrically isolate other partial areas of the TCO coating from one another.

Method steps for the impingement of a TCO coating deposited on a plastic substrate by means of an electron beam are already known. Due to the lower thermal load of a substrate, it is advantageous in the inventive method if the electron beam is used on the TCO coating with a spot irradiation time of 100 ns to 1 s.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

The invention claimed is:

1. A method for modifying a transparent and electrically conductive metal oxide coating deposited on a plastic substrate, the method comprising:
    impinging a surface region of the metal oxide coating by an electron beam, wherein the impingement on the surface region of the metal oxide coating by the electron beam occurs inside a vacuum chamber, wherein hydrogen, nitrogen, argon, or oxygen, or a gas mixture of at least two of the above-mentioned gases is introduced in the vacuum chamber while the surface region is impinged by the electron beam, and wherein the electron beam is operated with a spot irradiation time of 100 ns to 1 s.

2. The method of claim 1, wherein the electrical conductivity of the metal oxide coating is modified.

3. The method of claim 2, wherein the light transparency of the metal-oxide coating is modified.

4. The method of claim 1, wherein the light transparency of the metal-oxide coating is modified.

* * * * *